US011244220B2

(12) United States Patent
Huhtasalo et al.

(10) Patent No.: US 11,244,220 B2
(45) Date of Patent: Feb. 8, 2022

(54) METHOD FOR MANUFACTURING AN RFID TAG AND AN RFID TAG COMPRISING AN IC AND AN ANTENNA

(71) Applicant: Stora Enso OYJ, Helsinki (FI)

(72) Inventors: Lauri Huhtasalo, Tampere (FI); Eerik Halonen, Tampere (FI); Juha Ikonen, Nokia (FI)

(73) Assignee: Digital Tags Finland, OY, Tampere (FI)

( * ) Notice: Subject to any disclaimer, the term of this patent is extended or adjusted under 35 U.S.C. 154(b) by 0 days.

(21) Appl. No.: 16/760,992

(22) PCT Filed: Oct. 31, 2018

(86) PCT No.: PCT/IB2018/058522
§ 371 (c)(1),
(2) Date: May 1, 2020

(87) PCT Pub. No.: WO2019/087086
PCT Pub. Date: May 9, 2019

(65) Prior Publication Data
US 2020/0311508 A1 Oct. 1, 2020

(30) Foreign Application Priority Data

Nov. 3, 2017 (SE) .................................... 1751364-9

(51) Int. Cl.
*G06K 19/077* (2006.01)
*G06K 19/07* (2006.01)
(52) U.S. Cl.
CPC ..... *G06K 19/0775* (2013.01); *G06K 19/0723* (2013.01); *G06K 19/07745* (2013.01); *G06K 19/07775* (2013.01)
(58) Field of Classification Search
CPC ........... G06K 19/0775; G06K 19/0723; G06K 19/07745; G06K 19/07775
USPC ....................................................... 235/492
See application file for complete search history.

(56) References Cited

U.S. PATENT DOCUMENTS

| 7,663,564 | B2* | 2/2010 | Ayala ............... G06K 19/07783 343/741 |
| 8,988,827 | B1* | 3/2015 | Balamane ............. G11B 5/314 360/125.31 |
| 9,629,255 | B2 | 4/2017 | Maijala et al. |
| 2004/0174257 | A1* | 9/2004 | Kuhns .................. G06K 19/067 340/508 |
| 2007/0163704 | A1* | 7/2007 | Jarvinen ................ B31D 1/025 156/238 |
| 2007/0279230 | A1 | 12/2007 | Lakemann et al. |
| 2014/0368198 | A1* | 12/2014 | Espinosa .................. G01V 3/28 324/333 |
| 2015/0161503 | A1* | 6/2015 | Finn ................. G06K 19/07779 235/488 |
| 2017/0140257 | A1* | 5/2017 | Zenz ................ G06K 19/07754 |

FOREIGN PATENT DOCUMENTS

| CN | 202502521 U | 10/2012 |
| CN | 105787553 A | 7/2016 |
| EP | 1814067 A1 | 8/2007 |
| JP | 2014063965 A | 4/2014 |

* cited by examiner

Primary Examiner — Michael G Lee
Assistant Examiner — David Tardif
(74) Attorney, Agent, or Firm — Greer, Burns & Crain, Ltd.

(57) ABSTRACT

Method for manufacturing an RFID tag comprising an IC and an antenna. The method comprising the steps of providing an antenna made of a soldering material, which antenna is at least partly covered with a hot melt adhesive in solid form; heating the antenna to a temperature above its melting point, wherein the heated parts of the antenna and the hot melt adhesive melt, placing an IC in a predetermined position which position is suitable for the IC to connect to the antenna; pressing the IC and antenna together, such that, an electrical connection between the IC and the antenna is established; and cooling RFID tag, such that the hot melt adhesive and the antenna solidify, wherein a soldered joint between the IC and the antenna is achieved and the hot melt adhesive surrounds the joint between the IC and the antenna.

12 Claims, No Drawings

METHOD FOR MANUFACTURING AN RFID TAG AND AN RFID TAG COMPRISING AN IC AND AN ANTENNA

This application is a U.S. National Phase under 35 U.S.C. § 371 of International Application No. PCT/IB2018/058522, filed Oct. 31, 2018, which claims priority under 35 U.S.C. §§ 119 and 365 to Swedish Application No. 1751364-9, filed Nov. 3, 2017.

TECHNICAL FIELD

The present invention relates to method for manufacturing an RFID tag comprising an IC and an antenna. It also relates to an RFID tag comprising an IC and an antenna.

In the following the expression "hot melt adhesive" (HMA) (or "hot melt glue") will be frequently used. In this context this expression means a thermoplastic material with a specific melting point.

Moreover, the expression RFID (Radio Frequency Identification) tag will be used. An RFID tag is a tag that is used to be attached onto objects to be identified in a radio-frequency identification system. An RFID tag comprising an RFID chip, which is an IC (integrated circuit).

Moreover, the expression IC (Integrated Circuit) will be used. In this context it is the same as an RFID chip which is a part of an RFID tag. In an RFID tag the IC is electrically connected to an antenna.

Background—Problem

An RFID tag comprising an integrated circuit (IC) and an antenna. The IC is electrically connected to the antenna. With today's technology the IC is connected to the antenna with isotropically conductive adhesive (ICA) or anisotropically conductive adhesive (ACA). RFID tags that are produced in this way requires use of expensive conductive adhesive and curing process including pressure, temperature and time. The curing process needs to be done separate pressure element to each tag. These adhesives are sensitive for transportation and normally requires a cold chain. Its distribution to antenna is a process that need to be accurately controlled and it need time to cure, typically 6-10 seconds, with heated elements. These types of adhesives that are used are often also with limited life time. Moreover, many of these type of adhesives also contain chemicals which are not environmentally friendly or food contact approved (for examples epoxies containing bisphenol-A).

Object of Invention

An object of the invention is to present a method to manufacture an RFID tag and an RFID tag, wherein the IC is connected to the antenna in a new way. The inventive method and RFID tag solves the problem that are mentioned above.

SUMMARY OF THE INVENTION

In accordance of the invention the method for manufacturing the RFID tag is characterized in that it comprising the steps of:
provide an antenna made of a soldering material, which antenna is at least partly covered with a hot melt adhesive in solid form,
heating the antenna to a temperature above its melting point, wherein the heated parts of the antenna and the hot melt adhesive melt,
placing an IC in a predetermined position which position is suitable for the IC to connect to the antenna,
pressing the IC and antenna together, such that, an electrical connection between the IC and the antenna is established, and
cooling RFID tag, such that the hot melt adhesive and the antenna solidify, wherein a soldered joint between the IC and the antenna is achieved and the hot melt adhesive surrounds the joint between the IC and the antenna.

In accordance with the invention the RFID tag is characterized in that:
the antenna is made of a soldering material and that the IC is soldered into the antenna, and
the IC and the antenna are connected by a soldered joint which is surrounded by a hot melt adhesive in solid form.

DETAILED DESCRIPTION OF THE INVENTION

In the following the invention will be described more in detail, where an IC (RFID chip) is connected to an antenna of an RFID tag in a new inventive way.

In accordance with the present invention the attachment of the IC to the antenna is performed with soldering and hot melt adhesive (HMA). The soldering gives electrical and some mechanical connection and the HMA gives an extra mechanical connection and strength. Hence, the hot melt adhesive does not need to be electrical conductive.

The antenna in accordance with the invention is made of a soldering material, i.e. a metal alloy, and a preferred antenna material is Tin-Bismuth, Sn63Bi37. The manufacturing process of these antennas are described more in detail in WO2008/006941. The antenna is covered with a hot melt adhesive (HMA) in solid form. The HMA is applied onto the antenna, by first heating the HMA, wherein the HMA melts. Thereafter, the HMA is applied by coating, extruding, printing, spraying or any other method which will deposit a layer of HMA onto the antenna. In one embodiment the HMA is applied onto the antenna before the IC attachment step (see below). In alternative embodiment the HMA is applied onto the antenna already in the antenna manufacturing process. The thickness of the HMA layer onto the antenna depends on the thickness of the IC, i.e. the RFID chip. If the IC has a thickness in the range 75-120 micrometers and when the IC is pressed down to the HMA. At minimum the HMA should fill the gap between the chip and the antenna, and maximum it should not climb on top of the chip. On average the suggested thickness is about 5-50 micrometres. Example of suitable hot melt adhesives are PO (polyolefin-based hot melt adhesive) and EVA (Ethylene-Vinyl Acetate hot melt adhesive). However, those skilled in the art realize that other similar HMAs may be used.

The antenna, with the HMA applied onto it, is transported to a heating step where the antenna material becomes soft and partly melted and the HMA melts to become tacky and liquid. A preferred antenna metal alloy starts to melt from 138° C. and is completely liquid at 183° C. A preferred temperature range for this antenna would be around 140-170° C. However, an optimal temperature must also be taken with care of the HMA melt temperature, which also may differ depending on the choice of thermoplastic material. The heating may be performed in many various ways, such as oven, IR heating, laser, heating plate etc. so that it reaches a desired temperature (melting of both the antenna and the HMA) at the position where the IC is intended to be placed.

The RFID chip, i.e. the IC, having bumps, connection pads or similar that are intended to be placed at a predetermined position onto the antenna.

The IC is then pressed onto the soft antenna such that the IC (bumps, pads or similar) presses through the melted HMA and into the soft antenna. An electrical connection is here established between the IC and the antenna. The melted HMA, in liquid form, will surround the joint between the IC and the antenna.

After the IC attaching step, the ambient air will cool down the RFID tag, such that the HMA and the solder material solidifies. The solidified HMA will give an extra mechanical strength to soldered joint between the IC and the antenna. No forced cooling is necessary.

Some benefits with the present invention in comparison to conventional RFID tag manufacturing:

Shorter curing time per tag.
The adhesive application method and equipment is cheaper. HMAs are coated or printed at high speed, whereas ICP's or ACP's are dispensed or jetted with sophisticated, expensive and slow equipment.
Enables use of low cost material.
Lower RFID tag cost.
Fewer process steps.
Hot melt adhesives provide several advantages over solvent-based adhesives. Volatile organic compounds are reduced or eliminated, and the drying or curing step is eliminated. Hot melt adhesives have long shelf life and usually can be disposed of without special precautions. HMAs do not lose thickness during solidifying; solvent-based adhesives may lose up to 50-70% of layer thickness during drying. Moreover, HMAs are more environmentally friendly and can be accepted for indirect of direct food contact.

In the foregoing, the invention has been described on the basis of some specific embodiments. However, a skilled person realises that other embodiments and variants are possible within the scope of the following claims. For example the antenna may consist of different metal alloys with other melting points, the desired heating temperature is therefore desired upon this fact.

Moreover, not all parts of the antenna needs to be covered with the HMA in solid phase. It is enough if the parts of the antenna that are in contact with the IC are applied with HMA.

Moreover, the heating process can be performed before, after or at the same time as the IC has been placed in its position onto the antenna.

In an alternative embodiment, the HMA is applied onto the bottom of the IC, i.e. the side of the IC that facing against the antenna. In this embodiment the heating process is performed before or after the IC has been placed in its position onto the antenna.

The invention claimed is:

1. A method for manufacturing an RFID tag comprising an integrated circuit (IC) and an antenna, the method comprising the steps of:
    providing an antenna made of a soldering material,
    wherein the antenna is at least partly covered with a hot melt adhesive in solid form,
    heating the antenna to a temperature above a melting point of the antenna, wherein heated parts of the antenna and the hot melt adhesive melt,
    placing an IC in a predetermined position suitable for the IC to connect to the antenna,
    pressing the IC and antenna together, such that, an electrical connection between the IC and the antenna is established, and
    cooling such that the hot melt adhesive and the antenna solidify forming an RFID tag, wherein a soldered joint between the IC and the antenna is achieved and the hot melt adhesive surrounds the joint between the IC and the antenna.

2. The method according to claim 1, wherein the step of heating is performed before the step of placing the IC.

3. The method according to claim 1, wherein the step of placing of the IC is performed before the step of heating.

4. The method according to claim 1, wherein the step of placing of the IC is performed at the same time as the step of heating.

5. The method according to claim 1, wherein a side of the IC that facing the antenna is covered with a hot melt adhesive in solid form.

6. The method according to claim 1, wherein the antenna comprises tin-bismuth.

7. The method according to claim 1, wherein the hot melt adhesive comprises a polyolefin hot melt adhesive or an ethylene-vinyl acetate hot melt adhesive.

8. The method according to claim 3, wherein a side of the IC that facing the antenna is covered with a hot melt adhesive in solid form.

9. The method according to claim 4, wherein a side of the IC that facing the antenna is covered with a hot melt adhesive in solid form.

10. A method for manufacturing an RFID tag comprising an integrated circuit (IC) and an antenna, the method comprising the steps of:
    providing an antenna made of a soldering material,
    placing an IC in a predetermined position suitable for the IC to connect to the antenna, wherein a side of the IC that facing the antenna is covered with a hot melt adhesive in solid form,
    heating the antenna to a temperature above a melting point of the antenna, wherein heated parts of the antenna and the hot melt adhesive melt,
    pressing the IC and antenna together, such that, an electrical connection between the IC and the antenna is established, and
    cooling such that the hot melt adhesive and the antenna solidify forming an RFID tag, wherein a soldered joint between the IC and the antenna is achieved and the hot melt adhesive surrounds the joint between the IC and the antenna.

11. The method according to claim 10, wherein the antenna comprises tin-bismuth.

12. The method according to claim 10, wherein the hot melt adhesive comprises a polyolefin hot melt adhesive or an ethylene-vinyl acetate hot melt adhesive.

* * * * *